United States Patent [19]
Krautschneider et al.

[11] Patent Number: 5,882,969
[45] Date of Patent: Mar. 16, 1999

[54] METHOD FOR MANUFACTURING AN ELECTRICALLY WRITEABLE AND ERASABLE READ-ONLY MEMORY CELL ARRANGEMENT

[75] Inventors: Wolfgang Krautschneider, Hohenthann; Franz Hofmann, Munich; Hans Reisinger, Gruenwald; Josef Willer, Riemlerling, all of Germany

[73] Assignee: Siemens Aktiengesellschaft, Munich, Germany

[21] Appl. No.: 967,419

[22] Filed: Nov. 11, 1997

[30] Foreign Application Priority Data

Nov. 11, 1996 [DE] Germany .......................... 196 46 419.6

[51] Int. Cl.$^6$ .......................... H01L 21/336; H01L 29/78
[52] U.S. Cl. .......................... 438/259; 438/702; 257/316
[58] Field of Search .......................... 438/259; 257/315, 257/316

[56] References Cited

U.S. PATENT DOCUMENTS 5,498,560  3/1996  Sharma et al. .......................... 438/261
5,610,419  3/1997  Tanaka .......................... 257/315

FOREIGN PATENT DOCUMENTS 0 673 070  9/1995  European Pat. Off. .

*Primary Examiner*—Olik Chaudhuri
*Assistant Examiner*—Daniel H. Mao
*Attorney, Agent, or Firm*—Hill & Simpson

[57] ABSTRACT

In a method for manufacturing an electrically writeable and erasable ad-only memory cell arrangement, by self-adjusting process steps, a read-only memory cell arrangement having memory cells that respectively comprise an MOS transistor with a floating gate is manufactured. The MOS transistors are arranged in rows that run parallel. Adjacent rows thus respectively run alternately on the bottom of longitudinal trenches and between adjacent longitudinal trenches. The control gates laterally surround the floating gates so that the memory cells on the bottom of the longitudinal trenches also comprise a coupling ratio>1. A surface requirement per memory cell of $2F^2$(F minimum structural size) is achieved.

5 Claims, 3 Drawing Sheets

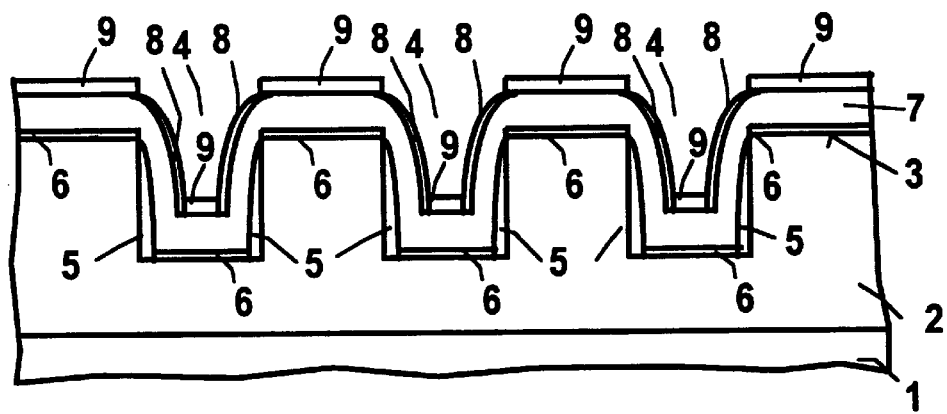
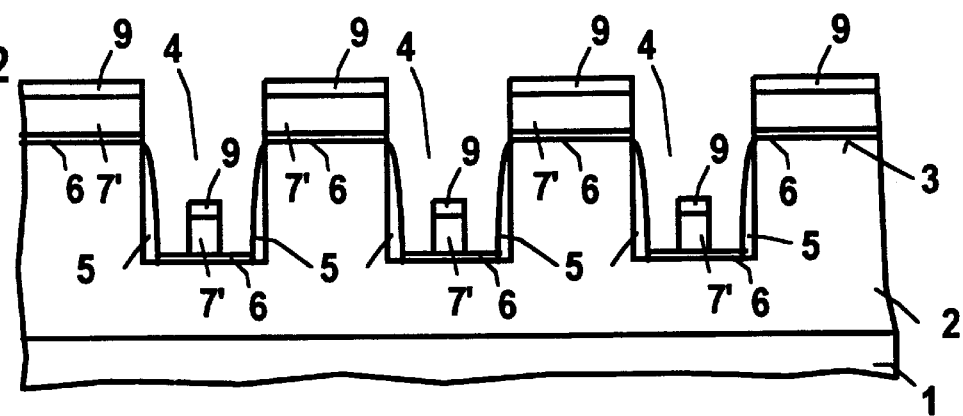
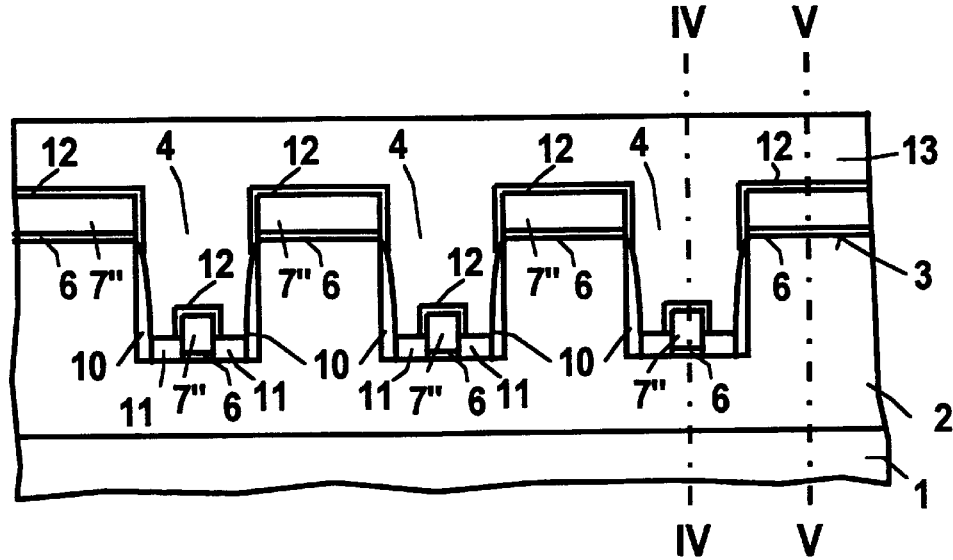

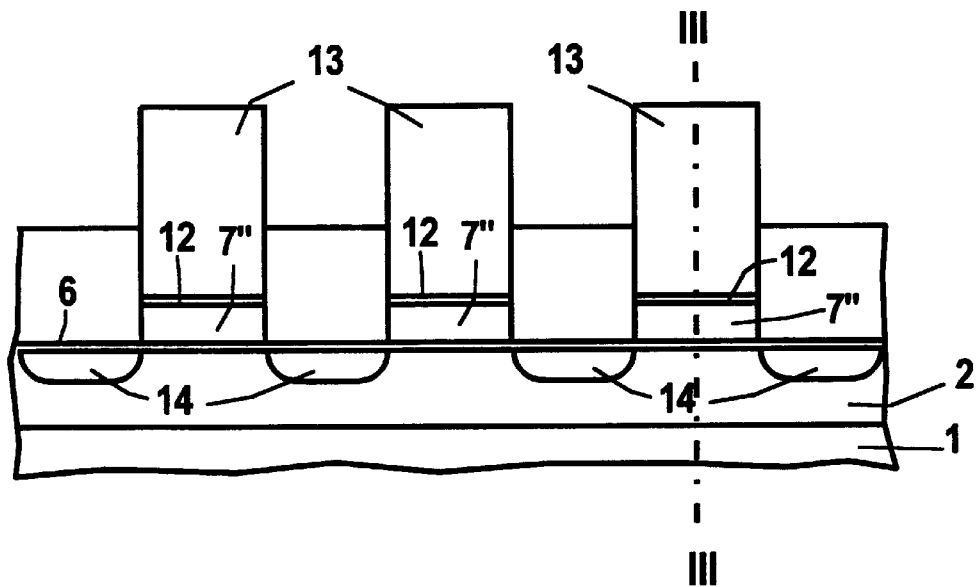
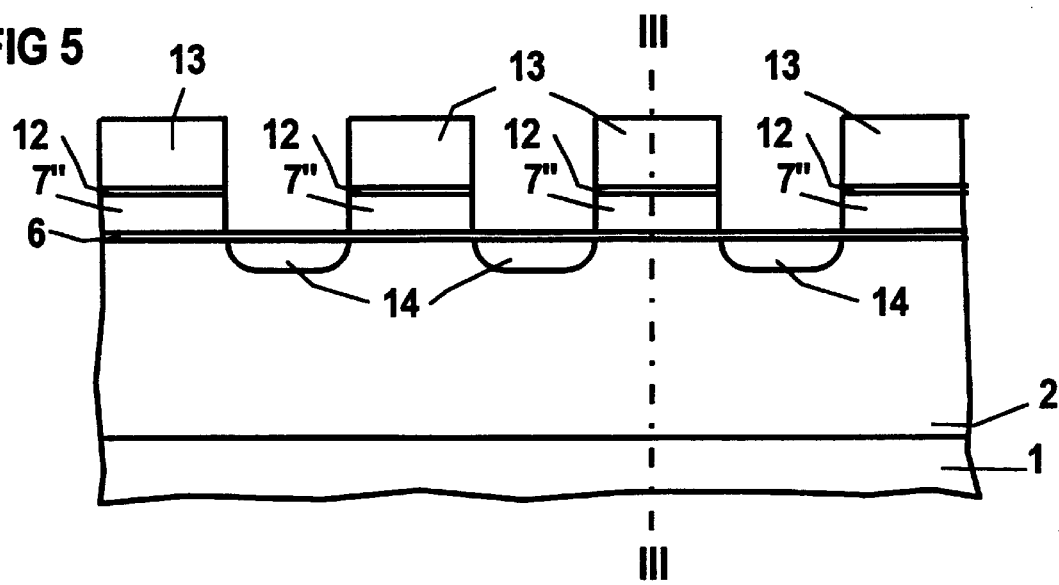

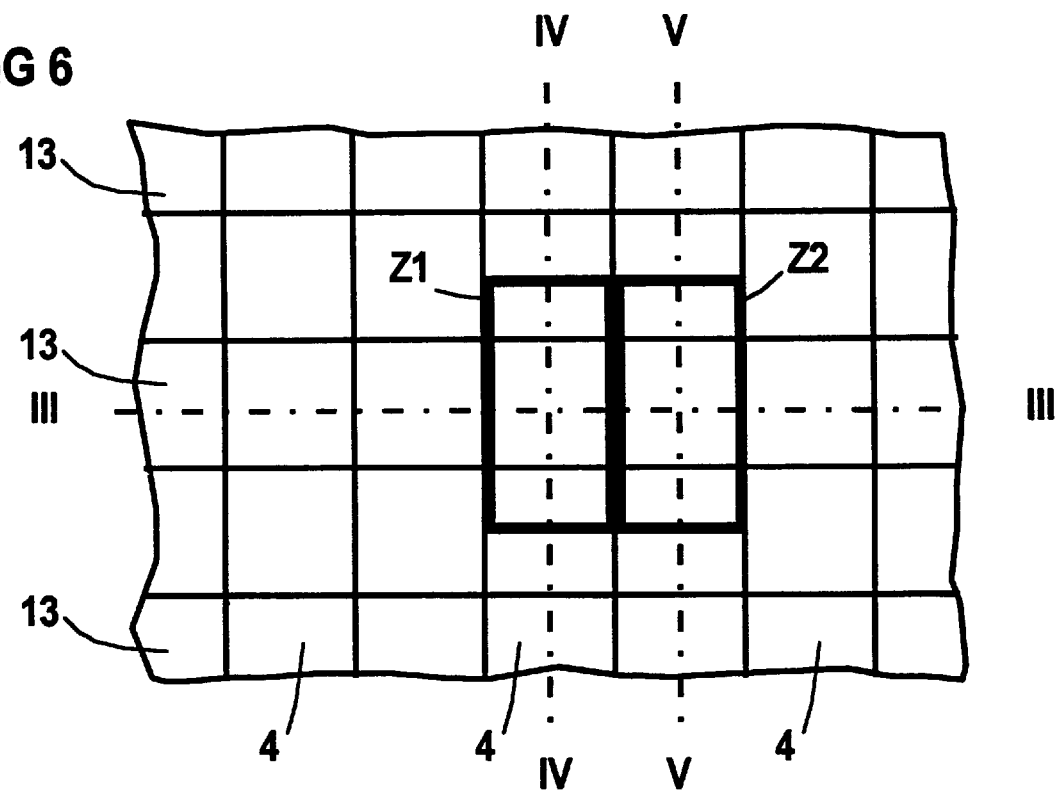

METHOD FOR MANUFACTURING AN ELECTRICALLY WRITEABLE AND ERASABLE READ-ONLY MEMORY CELL ARRANGEMENT

BACKGROUND OF THE INVENTION

For many applications, read-only memory cell arrangements with electrically writeable and electrically erasable read-only memory cells in silicon technology, known as flash EEPROM, are required. These flash EEPROM arrangements maintain the stored data even without a voltage supply.

Technologically, these memory cells are mostly realized by an MOS transistor comprising in the channel region a first dielectric, a floating gate, a second dielectric and a control gate. If a charge is stored on the floating gate, this influences the threshold voltage of the MOS transistor. In such a memory cell arrangement, the state charge on the floating gate" is allocated to a second logical value. The information is written into the memory cells via a Fowler-Nordheim tunnel current, through which electrons are injected onto the floating gate. The information is erased by a tunnel current in the opposed direction through the first dielectric.

The MOS transistors are formed in memory cell arrangements of this sort as planar MOS transistors, and are arranged in a planar cell architecture. In this way, the theoretically minimum surface requirement of a memory cell is $4F^2$, whereby F is the smallest manufacturable structural size in the respective technology. Flash EEPROM arrangements of this type are currently offered for data quantities of a maximum of 64 Mbit.

In EP 0 673 070 A2, an EEPROM arrangement was proposed in which planar MOS transistors in the sense of a NAND logic are connected in series. Source/drain regions connected with one another of adjacent MOS transistors are thus designed as a common doped region. The EEPROM arrangement is realized in a semiconductor substrate that is provided on a main surface with strip-shaped trenches running in parallel. The MOS transistors connected in series are respectively arranged on the bottom of the trenches or between adjacent trenches on the main surface of the substrate. Adjacent rows of MOS transistors are insulated against one another by the side wall of the trenches, and insulating spacers are provided on the side wall of the trenches. The floating gates of the MOS transistors arranged on the bottom of the trench respectively fill out the trench width. Due to the insulating spacers arranged on the side walls of the trenches, the width of the floating gate at the boundary surface to the second dielectric is slightly larger than at the boundary surface to the first dielectric. The known EEPROM arrangement thus comprises a coupling ratio close to one. The term coupling ratio designates the quotient of the capacitance between the control gate and the floating gate and the capacitance between the floating gate and the channel region.

SUMMARY OF THE INVENTION

An object of the invention is to provide a method for manufacturing an EEPROM arrangement in which a high packing density and an increased coupling ratio are achieved.

According to the method of the present invention for manufacturing an electrically writeable and erasable read-only memory cell arrangement, first the region doped by a first conductivity type is produced in a main surface of the semiconductor substrate. Longitudinal trenches are etched in the main surface that run substantially parallel within the region doped by the first conductivity type. The first dielectric layer is produced on a bottom of the trenches and between the trenches at the main surface. A first doped polysilicon layer is produced on the first dielectric layer. With the first auxiliary layer, spacers are formed by anisotropic etching, selected to the semiconductor, of the first auxiliary layer so that the spacers are formed on parts of the first polysilicon layer arranged at sides of the longitudinal trenches. A second auxiliary layer is produced on exposed parts of the first polysilicon layer. The spacers are then removed. The strip-shaped first polysilicon structures are formed by etching the first polysilicon layer using the second auxiliary layer as an etching mask, the polysilicon structures being arranged parallel to the longitudinal trenches on the main surface between adjacent longitudinal trenches and on the bottom of the longitudinal trenches, a width of the first polysilicon structure arranged on the bottom of the longitudinal trenches being smaller than a width of the trench so that in the longitudinal trenches sides of the first polysilicon structures are exposed. The second auxiliary layer is then removed. Insulating structures are formed on the bottom of the longitudinal trenches between the first polysilicon structure arranged there and the sides of the trench, the insulating structures having a height of less than the height of the first polysilicon structures. A second dielectric layer is then produced on top of and at sides of the first polysilicon structure in the trenches and on top of the first polysilicon structures between the trenches. With a second polysilicon layer which is deposited and structured, control gates are formed in the longitudinal trenches which connect with word lines that run parallel to the rows. For formation of floating gates, the second dielectric layer and the first polysilicon structure are structured by anisotropic etching corresponding to the word line. A source/drain implantation is carried out for the MOS transistors in which the word lines act as a mask.

In a main surface of a semiconductor substrate, a region doped as a first conductivity type is generated that is insulated against the semiconductor substrate. The insulation of the region doped by the first conductivity type against the semiconductor substrate can be comprised both of a pn junction and also of a buried insulating layer, e.g. the buried insulating layer of an SOI substrate. The insulation has the effect that a voltage can be applied to the region doped by the first conductivity type.

In the main surface, longitudinal trenches that run essentially parallel are etched inside the region doped by the first conductivity type. A plurality of memory cells arranged in rows, each cell comprising at least one MOS transistor, are produced. The rows are arranged alternately on the main surface between adjacent longitudinal trenches and on the bottom of the longitudinal trenches.

After a TEOS depositing and spacer etching, a first dielectric layer is, for example, produced, and a first doped polysilicon layer is produced thereon. Spacers are provided on the parts of the first polysilicon layer that are arranged on the edges of the longitudinal trenches. An auxiliary layer is produced on exposed parts of the first polysilicon layer, for which the spacers and the first polysilicon layer can be etched selectively.

The spacers are preferably formed from silicon nitride. The auxiliary layer is then selectively etched on the exposed surface of the first polysilicon layer by means of thermal oxidation.

Alternatively, the spacers are designed from $SiO_2$, which can be etched selectively to thermal silicon oxide. In a TEOS method, deposited $SiO_2$ can, for example, be wet-chemically etched selectively to thermal silicon oxide, in a ratio 1:3. The auxiliary layer is then formed by thermal oxidation. There thus also arises on the surface of the spacers a thin layer of thermal oxide, whose thickness is, however, much less than on the surface of the first polysilicon layer, and which is removed with the spacers. This embodiment has the advantage that mechanical stresses that can occur with the use of silicon nitride are avoided.

Subsequently, the spacers are removed selectively to the auxiliary layer. By means of etching of the first polysilicon layer with the use of the auxiliary layer as an etching mask, strip-type first polysilicon structures are formed, which, due to the shape of the auxiliary layer, are arranged parallel to the longitudinal trenches respectively on the main surface between adjacent longitudinal trenches and on the bottom of the longitudinal trenches. The width of the first polysilicon structures arranged on the bottom of the longitudinal trenches is thereby less than the trench width, so that in the longitudinal trenches the edges of the first polysilicon structure are exposed. The width of the first polysilicon structure in the longitudinal trenches is set via the thickness of the first polysilicon layer. The structuring of the first polysilicon layer occurs in self-adjusting fashion, i.e. without the use of photolithographically produced masks.

The auxiliary layer is removed. Insulating structures are formed that are arranged on the bottom of the longitudinal trenches, respectively, between the first polysilicon structure arranged there and the trench walls, and whose height is less than the height of the first polysilicon structures.

A second dielectric layer is produced. By means of depositing and structuring of a second polysilicon layer, control gates and word lines running transverse to the rows are produced. The control gates are formed in such a way that they also cover the edges of the first polysilicon structures arranged in the longitudinal trenches. The word lines are respectively connected with the control gates of MOS transistors arranged along different rows.

For the formation of the floating gates, the second dielectric layer and the first polysilicon structure are subsequently structured by anisotropic etching, corresponding to the word lines. A source/drain implantation is carried out for the MOS transistors, in which the word lines act as masks.

Since the edges of the first polysilicon structures, from which the floating gates are formed, and thereby the edges of the floating gates, are covered with the second dielectric layer and with the control gates, the capacitance between the control gates and the floating gates being greater than the capacitance between the floating gates and the channel region. A coupling ratio greater than 1 is thus achieved.

To manufacture the read-only memory cell arrangement, two photolithographically produced masks, each with strip-shaped openings, are required: the first for the formation of the longitudinal trenches, and the second for the structuring of the second polysilicon layer during the formation of the control gates and of the word lines. The adjustment of the masks to one another is unproblematic. If the strip-type openings are respectively formed with a width and a spacing of a structural size F that is the minimum that can be produced in the respective technology, the space requirement per memory cell is $2F^2$.

Preferably, spacers are formed on the side walls of the longitudinal trenches before the formation of the first doped polysilicon layer. The width of the first polysilicon structures that are arranged in the longitudinal trenches are thereby determined by the thickness of the first doped polysilicon layer and the width of the spacers. In this way, the thickness of the first doped polysilicon layer can be set independent of the width of the first polysilicon structures arranged respectively in the longitudinal trenches. The spacers are preferably formed from a material to which polysilicon can be etched selectively. They then act as an etching stop during the structuring of the first doped polysilicon layer, and protect the side walls of the longitudinal trenches from an etching attack. The spacers are formed, for example, from $SiO_2$.

BRIEF DESCRIPTION OF THE DRAWINGS

FIG. 1 shows a section through a semiconductor substrate with longitudinal trenches, a first dielectric layer, a first doped polysilicon layer, $Si_3N_4$ spacers and a mask of thermal $SiO_2$;

FIG. 2 shows the substrate after the formation of a first polysilicon structure;

FIG. 3 shows the substrate after the formation of insulating structures, of a second dielectric layer, control gates and word lines;

FIG. 4 shows the section designated IV—IV in FIG. 3;

FIG. 5 shows the section designated V—V in FIG. 3; and

FIG. 6 shows a view of the memory cell arrangement, in which the sections shown in FIG. 3, FIG. 4 and FIG. 5 are designated III—III, IV—IV and V—V.

DESCRIPTION OF THE PREFERRED EMBODIMENTS

In a substrate 1, made for example of monocrystalline silicon with an n-doping of $5 \times 10^{15}$ cm$^{-3}$, a p-doped well 2 is first produced, e.g. by masked implantation. The p-doped well 2 comprises a doping material concentration of e.g. $5 \times 10^{16}$ cm$^{-3}$. The p-doped well 2 is adjacent to a main surface 3 of the substrate 1 (see FIG. 1). It comprises a depth of e.g. 1.2 $\mu$m.

By means of the depositing of an $SiO_2$ layer in a TEOS method and the photolithographic structuring thereof, a trench mask is produced (not shown). By means of anisotropic etching e.g. $Cl_2$, longitudinal trenches 4 are etched using the trench mask as an etching mask. The longitudinal trenches 4 comprise a depth of e.g. 0.5 $\mu$m. The bottom of the longitudinal trenches 4 thereby lies in the p-doped well 2. The width of the longitudinal trenches 4 is e.g. 0.4 $\mu$m, and the length is e.g. 25 $\mu$m. The longitudinal trenches 4 run in parallel over the substrate 1. Their extension and number is large enough that they cover the region for memory cells to be produced later. For example, 1024 longitudinal trenches are arranged alongside one another.

The trench mask is subsequently removed wet-chemically, e.g. with hydrofluoric acid, or in a dry etching process, e.g. with $CHF_3$. An $SiO_2$ layer is then deposited, e.g. in a TEOS method, with a thickness of e.g. 40 nm to 100 nm. $SiO_2$ spacers 5 are formed on the side walls of the longitudinal trenches 4 from the $SiO_2$ layer by means of anisotropic etching. The surface of the p-doped well is thereby exposed on the bottom of the trench and between adjacent longitudinal trenches 4 in the region of the main surface 3.

A first dielectric layer 6 is subsequently formed by means of thermal oxidation. The first dielectric layer 6 made of $SiO_2$ is formed with a thickness of e.g. 8 nm. The thickness of the first dielectric layer 6 is thereby dimensioned in such a way that tunnel currents can be caused by voltages of 10 to 15 volts, which currents transmit so much charge, within microseconds to a few milliseconds, to a floating gate to be manufactured later that the threshold voltage $V_t$ exceeds the supply voltage $V_{dd}$ at the MOS transistor located thereunder.

Subsequently, a first polysilicon layer 7 is deposited with a thickness of e.g. 100 nm to 250 nm. The first polysilicon layer is n-doped. This can occur either in situ during the depositing or after the depositing by means of a phosphorus diffusion. The first polysilicon layer 7 comprises an essentially conformal edge covering, so that the thickness thereof on the main surface 3 and on the bottom of the trench is essentially of the same size as on the surface of the $SiO_2$ spacers 5 (see FIG. 1).

On the doped first polysilicon layer 7, an $Si_3N_4$ layer is deposited in a thickness of e.g. 20 nm to 50 nm. The $Si_3N_4$ layer comprises an essentially conformal edge covering. An anisotropic etching, e.g. with $CHF_3$, is carried out, in which the parts of the $SI_3N_4$ layer arranged in the planar regions are removed. $Si_3N_4$ spacers 8 thereby arise, which cover the first polysilicon layer 7 in the region of the edges of the longitudinal trenches 4 (see FIG. 1).

By means of a thermal oxidation, e.g. at 850° C., an $SiO_2$ structure 9 is selectively produced on the exposed surface of the first polysilicon layer 7 (see FIG. 1). Since the first polysilicon layer 7 was exposed in the region of the main surface 3 and on the bottom of the longitudinal trenches 4 after the formation of the $Si_3N_4$ spacers 8, the $SiO_2$ structure 9 covers the first polysilicon layer 7 in the region of the main surface 3 and on the bottom of the longitudinal trenches 4.

The $Si_3N_4$ spacers 8 are subsequently removed selectively to the $SiO_2$ structure 9. This occurs e.g. wet-chemically, using hot phosphoric acid. Parts of the first polysilicon layer 7 that are arranged in the region of the edges of the longitudinal trenches 4 are thereby exposed.

Using the $SiO_2$ structure 9 as an etching mask, the first polysilicon layer 7 is structured by means of a dry etching, which can be combined with a wet etching. First polysilicon structures 7' thereby arise. The etching occurs e.g. using $Cl_2$ or using $HF/HNO_3$. In the structuring of the first polysilicon layer 7, those parts of the first polysilicon layer 7 are removed that are arranged in the region of the edges of the longitudinal trenches 4. The first polysilicon structures 7' are thus strip-shaped, and are respectively arranged in the region of the main surface between adjacent longitudinal trenches 4, as well as on the bottom of the longitudinal trenches 4 (see FIG. 2). The width of the first polysilicon structures 7' that are arranged on the bottom of the longitudinal trenches 4 is thereby smaller, as it corresponds to the width of the longitudinal trenches 4. The width of the first polysilicon structures 7' in the longitudinal trenches 4 is set via the thickness of the first polysilicon layer 7 and the width of the spacers 8. The formation of the first polysilicon structures 7' ensues in a self-adjusting manner, i.e., without using photolithography.

The $SiO_2$ structure 9 is removed by means of a dry etching, e.g. using $CF_4$. The etching preferably occurs selectively to polysilicon. In this etching, which can be combined with a wet $SiO_2$ etching selective to silicon, the $SiO_2$ spacers 5 on the side walls of the trenches are also removed.

Subsequently, $SiO_2$ spacers 10 are again formed on the side walls of the longitudinal trenches 4, by means of depositing of an $SiO_2$ layer, using a TEOS method, with a layer thickness of e.g. 20 nm to 50 nm and an anisotropic spacer etching (see FIG. 3). Insulating structures 11, arranged on the bottom of the trench, are formed between the polysilicon structures 7' and the $SiO_2$ spacers 10. The insulating structures 11 are, for example, formed from $SiO_2$. The height of the insulating structures 11 is thus less than the height of the polysilicon structures 7', so that the edges of the first polysilicon structures 7' are partly exposed.

The insulating structures 11 are formed partly by deposition of an oxide that can be made to flow, e.g. borosilicate glass or TEOS $SiO_2$, and subsequent flowing. Alternatively, the intermediate space between the first polysilicon structure 7' and the $SiO_2$ spacers 10 is filled by depositing a TEOS $SiO_2$ layer. The insulating structures 11 are subsequently formed by back-etching of this $SiO_2$ layer.

After a reducing cleaning, the exposed surfaces of the first polysilicon structure 7' are provided with a second dielectric layer 12. The second dielectric layer 12 is for example formed by thermal oxidation from $SiO_2$ with a layer thickness of e.g. 14 nm. Alternatively, the second dielectric layer 12 is formed as a multiple layer with an $SiO_2$-$Si_3N_4$-$SiO_2$ layer sequence. For this purpose, an $SiO_2$ layer is first deposited with a layer thickness of e.g. 5 nm. An $Si_3N_4$ layer is deposited thereon in a layer thickness of e.g. 6 nm. An additional $SiO_2$ layer is subsequently formed thereon by thermal oxidation, in a layer thickness of e.g. 5 nm. An additional possibility for a suitable second dielectric is the use of nitrided oxide.

A second polysilicon layer is subsequently deposited. The second polysilicon layer is formed in a thickness that is larger than half the width of the longitudinal trenches 4. The second polysilicon layer thereby comprises an essentially planar surface. The second polysilicon layer is formed in a thickness of e.g. 300 nm.

After the formation of a photoresist mask (not shown), the second polysilicon layer is structured by means of anisotropic etching. Word lines 13 are thereby formed that run transversely to the longitudinal trenches 4 (see FIG. 3). The anisotropic etching of the second polysilicon layer ensues e.g. with $Cl_2$. By modification of the etching medium to $CF_4$, the second dielectric layer 12 is structured with the same photoresist mask. By renewed modification of the etching medium $Cl_2$, the first polysilicon structure 7' is structured again, whereby the surface of the first dielectric layer 6 and of the $SiO_2$ spacers 10 is exposed, and floating gates 7" are formed (see FIG. 4 and FIG. 5). The word lines 13 are formed in a width of e.g. 0.4 $\mu$m, with a spacing between adjacent word lines 13 of, likewise, e.g. 0.4 $\mu$m.

After the removal of the photoresist mask, a source/drain implantation is carried out, e.g. with arsenic, with an energy of 25 keV and a dosage of $5 \times 10^{15}$ $cm^{-2}$. During the source/drain implantation, doped regions 14 are produced on the bottom of the longitudinal trenches 4, as well as in the main surface 3 between the longitudinal trenches 4 (see FIG. 4 and FIG. 5). The doped regions 14 respectively act as a common source/drain region for two adjacent MOS transistors arranged along a row. During the source/drain implantation, the word lines 13 are doped at the same time.

The memory cell arrangement is produced by the depositing of an intermediate oxide, in which contact holes are opened using photolithographic process steps, and the formation of contacts by the deposition of a metal layer, e.g. by sputtering, and subsequent structuring of the metal layer. Each row at the edge of the ROM cell arrangement is thereby provided with two terminals, between which the MOS transistors arranged in the row are connected in series (not shown).

During the structuring of the first polysilicon structure 7', the floating gates 7" arise in such a way that they are respectively arranged under a word line 13. The part of the word lines 13 forming the boundary surface to the second dielectric layer 12 respectively acts as a control gate. The parts of the word lines 13 arranged in the longitudinal trenches 4 thereby completely fill the intermediate space between the SiO$_2$ spacers 10 and the floating gates 7", covered with the second dielectric layer 12.

Each two adjacent doped regions 14, and the word line 13 arranged between them, respectively form an MOS transistor. The part of the p-doped well 2 arranged between the two doped regions 14 thereby forms the channel region of the MOS transistor. Above the channel region are arranged the first dielectric layer 6 as a tunnel oxide, the floating gate 7", the second dielectric 12 and a control gate that is formed from the part of the word line 13 that runs above the channel region.

The capacitance between the part of the word line 13 that acts as a control gate and the floating gate 7" is determined by the surface of the second dielectric layer 12. The capacitance between the floating gate 7" and the channel region is determined by the boundary surface of the floating gate 7" to the first dielectric layer 6. In the example described, a coupling ratio (i.e., the ratio of the capacitance between the control gate and the floating gate as well as the capacitance between the floating gate and the channel region) in the range from 1.5 to 2 is achieved.

On the bottom of each of the longitudinal trenches 4, as well as between the longitudinal trenches 4 in the region of the main surface 3, a row of transistors is connected in series, each row formed from two doped regions 14 and the word lines 13 arranged between them. The MOS transistors arranged on the bottom of a longitudinal trench 4 are insulated from the adjacent MOS transistors arranged between the longitudinal trenches 4 on the main surface 3 by the SiO$_2$ spacers 10.

The width of the longitudinal trenches 4, the spacing between adjacent longitudinal trenches 4, the width of the word lines 13, and the distance between adjacent word lines 13 are preferably formed respectively with a dimension corresponding to a minimum structural size F that can be produced in the respective technology. If it is taken into account that each of the doped regions 14 is a source/drain region for two adjacent MOS transistors, the length of each MOS transistor parallel to the run of the longitudinal trenches 4 is 2F. The width of each of the MOS transistors is F. As a result of the manufacturing, the surface for a memory cell formed from an MOS transistor is thus 2F$^2$. Memory cells that are adjacent along a word line 13, whose contours Z1, Z2 are drawn in with bold lines in the view in FIG. 6, border immediately on one another in the projection to the main surface 3. The memory cell Z1 is arranged on the bottom of one of the longitudinal trenches, while the memory cell Z2, in contrast, is arranged on the main surface 3 between two adjacent longitudinal trenches 4. By means of the height-displaced arrangement of adjacent memory cells, the packing density is increased without worsening the insulation between adjacent memory cells.

The programming of the electrically writeable and erasable ROM cell arrangement ensues by means of the injection of electrons from the channel region of the respective MOS transistor onto the associated floating gate 7". According to the electrical charge located on the floating gate 7", the corresponding MOS transistor comprises a low or a high threshold voltage. A high threshold voltage, allocated to a first logical value, is caused by a positive voltage of e.g. 10 to 15 volts, applied between the word line 13, which acts as a control gate, and the p-doped well 2, which is insulated against the substrate 1 by a pn junction. This voltage has the effect that electrons are injected to the floating gate via a Fowler-Nordheim tunnel current.

A second logical value is allocated to a low threshold voltage. For this purpose, the corresponding floating gate 7" is discharged. This ensues by means of the application of a negative potential of from −10 to −15 volts between the p-doped well 2 and the control gate 13. By this means, a tunnel current through the first dielectric layer 6 is effected, via which the electrons flow away from the floating gates 7" within microseconds to a few milliseconds.

By means of the use of several voltage levels in the injection of electrons to the floating gate 7", the electrically writeable and readable memory cell arrangement can also be programmed according to a multivalent logic.

Although various minor changes and modifications might be proposed by those skilled in the art, it will be understood that our wish is to include within the claims of the patent warranted hereon all such changes and modifications as reasonably come within our contribution to the art.

We claim as our invention:

1. A method for manufacturing an electrically writeable and erasable read-only memory cell arrangement, comprising the steps of:

producing a region doped by a first conductivity type in a main surface of a semiconductor substrate;

etching longitudinal trenches that run substantially parallel in the main surface within the region doped by the first conductivity type;

producing a first dielectric layer on the main surface and at the bottom of the trenches;

producing a first doped polysilicon layer on the first dielectric layer;

depositing a first auxiliary layer on the first doped polysilicon layer and anisotropically etching the first auxiliary layer so that spacers are formed on parts of the first polysilicon layer arranged at sides of the longitudinal trenches;

producing a second auxiliary layer between the first auxiliary layer spacers in the trenches and also on top of parts of the first polysilicon layer in the trenches;

removing the first auxiliary layer spacers from the parts of the first polysilicon layer in the trenches;

etching the first polysilicon layer using the second auxiliary layer as an etching mask to form strip-shaped first polysilicon structures at the bottoms of the trenches and also between adjacent trenches, a width of the first polysilicon structures at the bottom of the longitudinal trenches being smaller than a width of the respective trenches so that in the longitudinal trenches sides of the first polysilicon structures are exposed;

removing the second auxiliary layer;

providing insulating structures on the bottom of the longitudinal trenches alongside the respective first polysilicon structures, the insulating structures having a height less than a height of the first polysilicon structures in the trenches;

producing a second dielectric layer overlying a top and sides of the first polysilicon structures between the trenches and also overlying and at upper portions of sides of the first polysilicon structures within the trenches;

depositing and structuring a second polysilicon layer overlying the second dielectric layer so as to provide control gates in the trenches which are part of word lines that run transverse to the longitudinal trenches;

for formation of floating gates from the polysilicon structures, structuring the second dielectric layer and the first polysilicon structures by anisotropic etching; and carrying out a source/drain implantation for MOS transistors in the first conductivity type region wherein the word lines act as a mask.

2. The method according to claim 1, including the step of forming dielectric spacers on the sides of the longitudinal trenches before the formation of the first doped polysilicon layer.

3. The method according to claim 1 including the step of forming the second auxiliary layer from thermal silicon oxide and forming the first auxiliary layer from silicon nitride.

4. The method according to claim 1 including the step of forming the second auxiliary layer from thermal silicon oxide and forming the first auxiliary layer from silicon oxide that can be etched selectively to thermal silicon oxide.

5. A method for manufacturing an electrically writeable and erasable read-only memory cell arrangement, comprising the steps of:

producing a region doped by a first conductivity type in a main surface of a semiconductor substrate;

etching longitudinal trenches that run substantially parallel in the main surface within the region doped by the first conductivity type;

producing a first dielectric layer on the main surface and at the bottom of the trenches;

producing a first doped polysilicon layer on the first dielectric layer;

depositing a first auxiliary layer on the first doped polysilicon layer and anisotropically etching the first auxiliary layer so that spacers are formed on parts of the first polysilicon layer arranged at sides of the longitudinal trenches;

producing a second auxiliary layer between the first auxiliary layer spacers in the trenches and also on top of parts of the first polysilicon layer in the trenches;

removing the first auxiliary layer spacers from the parts of the first polysilicon layer in the trenches;

etching the first polysilicon layer using the second auxiliary layer as an etching mask to form strip-shaped first polysilicon structures at the bottoms of the trenches and also between adjacent trenches, a width of the first polysilicon structures at the bottom of the longitudinal trenches being smaller than a width of the respective trenches so that in the longitudinal trenches sides of the first polysilicon structures are exposed;

removing the second auxiliary layer;

providing insulating structures on the bottom of the longitudinal trenches alongside the respective first polysilicon structures, the insulating structures having a height less than a height of the first polysilicon structures in the trenches;

producing a second dielectric layer overlying a top and sides of the first polysilicon structures between the trenches and also overlying and at upper portions of sides of the first polysilicon structures within the trenches;

depositing and structuring a second polysilicon layer overlying the second dielectric layer so as to provide control gates in the trenches which are part of word lines that run transverse to the longitudinal trenches; and carrying out a source/drain implantation for MOS transistors in which the word lines act as a mask.

* * * * *